(12) United States Patent
Hill et al.

(10) Patent No.: US 12,235,140 B2
(45) Date of Patent: Feb. 25, 2025

(54) TECHNIQUE FOR SPATIALLY RESOLVING TEMPERATURE AND STRAIN MEASUREMENTS VIA BRILLOUIN SCATTERING

(71) Applicant: NKT Photonics GmbH, Cologne (DE)

(72) Inventors: Wieland Hill, Odenthal (DE); Alexander Rath, Hürtgenwald (DE); Benjamin Marx, Cologne (DE); Thorben Jostmeier, Haan (DE)

(73) Assignee: NKT Photonics GmbH, Cologne (DE)

( * ) Notice: Subject to any disclaimer, the term of this patent is extended or adjusted under 35 U.S.C. 154(b) by 437 days.

(21) Appl. No.: 17/535,043

(22) Filed: Nov. 24, 2021

(65) Prior Publication Data
US 2022/0178724 A1 Jun. 9, 2022

(30) Foreign Application Priority Data
Dec. 3, 2020 (DE) .......................... 102020132210.0

(51) Int. Cl.
*G01D 5/353* (2006.01)
*G01K 11/322* (2021.01)
*G01L 1/24* (2006.01)

(52) U.S. Cl.
CPC ....... *G01D 5/35364* (2013.01); *G01K 11/322* (2021.01); *G01L 1/242* (2013.01)

(58) Field of Classification Search
CPC .. G01D 5/35364; G01L 1/242; G01K 11/322; G01K 11/32; G01K 2011/322; G02B 6/2773; G01B 9/02; G01H 9/00
USPC .......................................... 356/73.1, 213–226
See application file for complete search history.

(56) References Cited

U.S. PATENT DOCUMENTS

| | | | | |
|---|---|---|---|---|
| 9,933,322 | B2* | 4/2018 | Hill | ..................... G01D 5/35364 |
| 10,274,345 | B2* | 4/2019 | Lanticq | ............... G01D 5/35358 |
| 2008/0316494 | A1 | 12/2008 | Hartog et al. | |
| 2010/0014071 | A1 | 1/2010 | Hartog | |
| 2011/0090936 | A1 | 4/2011 | Kupershmidt | |

(Continued)

FOREIGN PATENT DOCUMENTS

| | | |
|---|---|---|
| CN | 1547672 A | 11/2004 |
| CN | 101031830 A | 9/2007 |

(Continued)

OTHER PUBLICATIONS

Berthiaume, D et al., "Low current, 100MHz bandwidth envelope detector for CMOS PFIC PAs" 2016 IEEE Canadian Conference on Electrical and Computer Engineering (CCECE). IEEE, 2016, S. 1-4.

(Continued)

*Primary Examiner* — Hoa Q Pham
(74) *Attorney, Agent, or Firm* — Edell, Shapiro & Finnan, LLC

(57) ABSTRACT

An apparatus for digitizing an optical signal comprises: an optical detector to detect an optical signal and to generate an electric signal corresponding to the optical signal; an envelope curve detector to determine the amplitude of the electric signal or a modified electric signal resulting from the electric signal, and to supply an amplitude signal corresponding to the amplitude; an analog to digital converter to digitize the amplitude signal and to supply a corresponding digitized amplitude signal; and a variable voltage source to calibrate the envelope curve detector.

15 Claims, 2 Drawing Sheets

(56) References Cited

U.S. PATENT DOCUMENTS

| | | | |
|---|---|---|---|
| 2012/0200354 A1 | 8/2012 | Ripley et al. | |
| 2015/0028865 A1* | 1/2015 | Putinier | G05F 1/563 324/251 |
| 2018/0048322 A1* | 2/2018 | Katyal | H03L 7/0896 |
| 2018/0149588 A1 | 5/2018 | Fortunato et al. | |

FOREIGN PATENT DOCUMENTS

| | | | |
|---|---|---|---|
| CN | 106331257 A | 1/2017 |
| CN | 106482780 A | 3/2017 |
| CN | 108344559 A | 7/2018 |
| CN | 108344560 A | 7/2018 |
| CN | 108731708 A | 11/2018 |
| CN | 110470327 A | 11/2019 |

OTHER PUBLICATIONS

Zhao, L., et al., "Performance analysis of temperature and strain simultaneous measurement system based on coherent detection of Brillouin scattering" 4th International Symposium on Advanced Optical Manufacturing and Testing Technologies: Optical Test and Measurement Technology and Equipment vol. 7283. International Society for Optics and Photonics, 2009, S. 72830T-1-7.

English translation of the Notification of the First Office Action in Chinese Application No. 202111463639.X, dated Sep. 19, 2023, 11 pages.

\* cited by examiner

TECHNIQUE FOR SPATIALLY RESOLVING TEMPERATURE AND STRAIN MEASUREMENTS VIA BRILLOUIN SCATTERING

CROSS REFERENCE TO RELATED APPLICATIONS

This application claims foreign priority under 35 U.S.C. § 119(a)-(d) to Application No. DE 102020132210.0 filed on Dec. 3, 2020, the entire contents of which are hereby incorporated by reference.

TECHNICAL FIELD

The present disclosure relates to an apparatus and a method for digitization of an optical signal as well as an apparatus for spatially resolved measurement of temperature and strain via Brillouin scattering.

BACKGROUND

Apparatuses and methods for spatially resolved measurement of temperature and strain via Brillouin scattering of the aforementioned type are known from European patent EP 3 139 133 A1. In the apparatus described therein, laser radiation emitted from a laser light source is coupled into an optical fiber used for measurement. The Brillouin signals generated by the laser radiation in the optical fiber due to Brillouin scattering are coupled out. The coupled-out Brillouin signals are split by an optical polarization beam splitter into two components having polarizations that are different from one another, wherein an optical coupler is used to admix the laser radiation to the individual components of the Brillouin signal. These mixed signals are detected separately from one another by sensors designed, for example, as photodetectors. Furthermore, there is provided an evaluator that can determine in a spatially resolved manner the temperature and the strain of sections of the optical fiber from the detected Brillouin signals. In so doing, the frequency of the Brillouin signal is detected by the evaluator.

Brillouin scattering in optical fibers can be used for a distributed or spatially resolved measurement of temperature and strain along the optical fiber, because the frequency and the amplitude of the Brillouin scattering are a function of the measurement parameters: temperature and strain.

Frequently only the Brillouin frequency is measured. The frequency depends with high sensitivity on the measurement parameters, for example, with about 1 MHz/° C. or 0.05 MHz/µε in quartz glass and can be determined very accurately. However, in this case there is the problem of separating the influence of both measurement parameters: temperature and strain.

A separation of the two measurement parameters is possible in some cases by comparative measurements on optical fibers, which are installed in different ways, such as, for example, loose tubes with a loose fiber or a tight tube with a fixed fiber (see in this respect: Inaudi & Glisic, 2006, Reliability and field testing of distributed strain and temperature sensors 6167, 61671D-61671D-8). As an alternative, measurements of the Brillouin frequencies either in fibers with multiple Brillouin peaks (see in this respect: Liu & Bao, 2012, Brillouin Spectrum in LEAF and Simultaneous Temperature and Strain Measurement, Journal of Lightwave Technology, 30 (8), 1053-1059) or in oligo mode fibers with few different spatial modes (see in this respect: Weng, Ip, Pan, & Wang, 2015, Single-end simultaneous temperature and strain sensing techniques based on Brillouin optical time domain reflectometry in few-mode fibers, Opt. Express, 23 (7), 9024-9039) with different dependences of the frequency on temperature and strain can also be used to separate the measurement parameters.

However, none of these methods is suitable for general use, because suitable optical fibers are not always available for the application. In addition, the installation and the measurement of a number of optical fibers or special fibers are associated with increased complexity.

Another method for separating the two measurement parameters is the measurement of frequency and amplitude of one or more Brillouin peaks. Examples of the measurement of frequency and amplitude of one or more Brillouin peaks may be found in Parker, Farhadiroushan, Handerek, & Rogers, 1997, Temperature and strain dependence of the power level and frequency of spontaneous Brillouin scattering in optical fibers, Opt. Lett., 22 (11), 787-789, and in Maughan, Kee, & Newson, 2001, Simultaneous distributed fibre temperature and strain sensor using microwave coherent detection of spontaneous Brillouin backscatter, Measurement Science and Technology, 12 (7), 834.

By measuring the frequency and amplitude of one or more Brillouin peaks, it is possible to obtain two independent measurement parameters, from which the two physical parameters, temperature and strain, which are sought, can be determined, in principle. However, the dependence of the amplitude on the temperature and strain is weak and amounts, for example, to approximately 0.3%/° C. Therefore, the amplitude must be measured very precisely to achieve practically relevant temperature resolutions and accuracies of about 1° C.

In particular, the separation of both measurement parameters by the frequencies of multiple Brillouin peaks has turned out to be problematic, because the coefficients of the frequencies with respect to temperature and strain dependence are quite similar for the various peaks in a fiber. Therefore, the noise is increased significantly when the measurement parameters are calculated separately.

Furthermore, in order to use Brillouin scattering for measuring the temperature and strain in Brillouin DTS (distributed temperature sensing) systems, the amplitude has to be measured linearly over a large dynamic range, such as, for example, 20 dB or 30 dB. The reason for this lies in the fact that, on the one hand, the attenuation of fiber optic cables and the losses at plugs, splicings and other kinds of fiber connections decrease the signal amplitude with increasing length of the fiber. At a typical fiber length of 100 km and an attenuation of 0.2 dB/km the total loss in one direction without connections is already 20 dB. On the other hand, effects, such as polarization fading, generate an additional variation in the signal level, which must also be covered by the dynamic range of a detector.

SUMMARY

Disclosed herein is an apparatus of the aforementioned type for digitizing an optical signal and a method of the aforementioned type for digitizing an optical signal, with which apparatus and method the amplitudes of an optical signal can be determined very accurately and/or in a large dynamic range. Furthermore, the described methods and apparatus can more easily and/or more precisely determine spatially resolved measurement of temperature and strain via Brillouin scattering.

The aforesaid is achieved by an apparatus and method of the aforementioned type for digitizing an optical signal, as well as by an apparatus and method of the aforementioned type for spatially resolved measurement of temperature and strain via Brillouin scattering.

According to an example implementation, the apparatus comprises: an optical detector, in particular, a photodetector that is configured to detect an optical signal and to generate an electric signal, corresponding to the optical signal, an envelope curve detector that is configured to determine the amplitude of the electric signal, generated by the optical detector, or to determine the amplitude of an electric signal, resulting from this electric signal, and to output an electric signal, corresponding to this amplitude, an analog to digital converter that is configured to digitize the electric signal, outputted from the envelope curve detector and to output the corresponding data, a variable voltage source with an output, which is connected or can be connected to an input of the envelope curve detector, wherein the apparatus is configured to calibrate the envelope curve detector with the variable voltage source.

Since the influence of the temperature and strain effects on the amplitude of Brillouin signals is fairly weak, very accurate amplitude measurements are necessary in order to obtain a sufficient temperature resolution and accuracy with an amplitude and frequency-based Brillouin DTS. Non-calibrated envelope curve detectors cannot offer such a precision.

In a linear measurement a particular change in the optical Brillouin signal is converted into a particular change in the measured voltage, which is independent of the absolute signal strength. In order to perform a correct temperature and strain measurement at any point on the fiber, a linear measurement over a large dynamic range is necessary. Non-calibrated envelope curve detectors cannot offer such a linearity.

For example, BOTDR DTS (Brillouin optical time domain reflectometry distributed temperature sensing) systems generally convert the optical Brillouin signal into an electric high frequency signal and then filter as well as amplify this signal. The amplitude of such a signal can be determined with the aid of an envelope curve detector. An envelope curve detector removes the carrier frequency from the signal and allows the amplitude to be sampled and/or digitized at the lower signal modulation frequency. In principle, the high frequency signal is rectified and then filtered for smoothing. There are various embodiments of envelope curve detectors, such as full wave or half wave rectification, various filters or active precision rectifiers with operational amplifiers. All of these designs have severe restrictions with respect to nonlinearity and temperature dependence of the output signals.

The nonlinearity at small signal amplitudes is primarily due to the threshold voltage of the rectifier diodes, which are used in the detectors. This threshold prevents the detection of weak signals and makes the diode properties nonlinear at low voltages. This limitation is partially overcome by active rectifiers, but not completely eliminated. In this case active rectifiers use amplifier circuits, which may have other problems, such as temperature drift, signal offset or voltage-dependent amplification.

In the case of high signals, nonlinearity can occur due to the decreasing amplification at output voltages that approach the supply voltage level. Furthermore, a temperature dependence of the amplifier output may result from the offset or amplification fluctuations in conjunction with temperature dependent active or passive components, such as transistors or resistors. Another problem is the variation in the properties of components that can result in slightly different amplification profiles for different detectors or amplifiers within a charge or from charge to charge.

For example, FIG. 4 shows the temperature dependence of a typical envelope curve detector. In this case the strength of the input signal in shown in dB on the abscissa; and the output signal is shown in arbitrary units on the ordinate. The solid line corresponds to a temperature of the envelope curve detector of 5° C.; the dotted line corresponds to a temperature of the envelope curve detector of 25° C.; and the dashed line corresponds to a temperature of the envelope curve detector of 55° C. It shows, in particular, at very small signals a strong nonlinearity and a large temperature dependence of the output on the temperature.

The variable voltage source, provided according to the disclosed method and apparatus, can be used to calibrate the envelope curve detector such that despite a typical strong nonlinearity and temperature dependence of the envelope curve detector a comparatively accurate measurement over a large dynamic range is made possible.

There is the option that the voltage source is configured to generate a variable voltage signal that has the same or a similar frequency as the electric signal, which is generated from the optical signal. In particular, the voltage signals, generated by the variable voltage source, are in a frequency range that is equal to, smaller or larger than the frequency range of the electric signals, generated from the optical signal. In particular, the frequency range of the voltage signals, generated by the variable voltage source, can cover the electric signals, generated from the optical signal. As an alternative, the voltage signals, generated by the variable voltage source, can also have only a single frequency or a narrow frequency range, which is in the frequency range of the electric signals, generated from the optical signal.

For example, the frequency range of the electric signals, generated from the optical signal, may be between 823.5 MHz and 935 MHz. In this case the voltage signals, generated by the variable voltage source, may be in a frequency range that ranges from at least 823.5 MHz to 935 MHz. In this respect it is certainly possible that the frequency range of the voltage signals, generated by the variable voltage source, is larger, thus, for example, ranges from 800 MHz to 960 MHz. As an alternative, in this example it can also be provided that the frequency range of the voltage signals, generated by the variable voltage source, is smaller and is within the frequency range of the electric signals, generated from the optical signal. For example, the voltage signals, generated by the variable voltage source, may have a constant frequency of 890 MHz +/−3 ppm.

In addition to the Brillouin DTS, the disclosed apparatus for digitizing an optical signal can be used for a number of other applications that require precise measurements of the amplitude of high frequency optical or electric signals.

It can be provided that the apparatus comprises a bandpass filter that is arranged between the optical detector and the envelope curve detector. In this case the bandpass filter is configured to filter out of the electric signal, generated by the optical detector, a direct current component and/or at least one frequency range that is not needed and/or has proved to be interfering when the amplitude is determined by the envelope curve detector. Furthermore, the apparatus may comprise an amplifier, which is arranged between the optical detector and the envelope curve detector or between the optical detector and the bandpass filter. In this case the amplifier is configured to amplify the electric signal, generated by the optical detector, with the amplifier being, in particular, a transimpedance amplifier.

There is the option that the apparatus comprises a switch that is arranged, on the one hand, between the optical detector or the amplifier or the bandpass filter and the envelope curve detector as well as, on the other hand, between the variable voltage source and the envelope curve detector. In this case the switch is configured either to send to the input of the envelope curve detector the electric signal, generated indirectly or directly by the optical detector, or to connect the output of the variable voltage source to the input of the envelope curve detector.

It may be provided that the apparatus comprises an amplifier that is arranged between the envelope curve detector and the analog to digital converter. In this case the amplifier is configured to amplify the electric signal, generated by the envelope curve detector.

There is the option that the apparatus comprises a digital processing apparatus that is configured to store calibration data, which are generated during the calibration of the envelope curve detector, and, using these calibration data, to normalize the data, outputted from the analog to digital converter.

According to a disclosed method: an optical signal is detected; an electric signal, corresponding to the optical signal, is generated; the amplitude of the generated electric signal or the amplitude of an electric signal, resulting from this electric signal, is determined by an envelope curve detector; and an electric signal, corresponding to this amplitude, is outputted; the electric signal, outputted from the envelope curve detector, is digitized; and the data, corresponding to the digitization, are outputted; the envelope curve detector is calibrated with a variable voltage source.

In this respect, it may be provided that during the calibration of the envelope curve detector a plurality of mutually different voltages, which are sent to an input of the envelope curve detector, are generated by the variable voltage source. Preferably, in this case, the voltage source can be used for calibrating the envelope curve detector and any possible amplifier behind the switch position over the entire voltage range to be measured. In this case, the voltage source should supply, if possible, a variable voltage signal having the same or a similar frequency as the photovoltage to be detected. Furthermore, the output of the voltage source should be adjustable over the whole range of the photovoltages to be expected.

There is the option that the voltage source generates a variable voltage signal that has the same or a similar frequency as the electric signal that is generated from the optical signal. In particular, the voltage signals, generated by the variable voltage source, can be in a frequency range that is equal to, smaller or larger than the frequency range of the electric signals, generated from the optical signal. In particular, in this case the frequency range of the voltage signals, generated by the variable voltage source, can cover the frequency range of the electric signals, generated from the optical signal. As an alternative, the voltage signals, generated by the variable voltage source, can also have only a single frequency or a narrow frequency range that is in the frequency range of the electric signals, generated from the optical signal.

For example, the frequency range of the electric signals, generated from the optical signal, may be between 823.5 MHz and 935 MHz. In this case the voltage signals, generated by the variable voltage source, may be in a frequency range that ranges from at least 823.5 MHz to 935 MHz. In this respect, it is certainly possible that the frequency range of the voltage signals, generated by the variable voltage source, is larger, thus, for example, ranges from 800 MHz to 960 MHz. As an alternative, in this example it can also be provided that the frequency range of the voltage signals generated by the variable voltage source is smaller and is within the frequency range of the electric signals generated from the optical signal. For example, the voltage signals, generated by the variable voltage source, may have a constant frequency of 890 MHz +/−3 ppm.

Furthermore, it may be provided that the calibration of the envelope curve detector is carried out at a plurality of mutually different temperatures of the envelope curve detector. The calibration can be carried out at any temperature within the expected range of the operating temperatures of the receiver. Such a system can almost completely cancel out any nonlinearity effects and temperature effects on the receiver components behind the switch position.

In order to further increase the accuracy of the measurement, it is certainly possible to calibrate also the variable voltage source prior to the use thereof.

There is the option that the calibration data, which are stored and used to normalize the outputted data, are generated during the calibration of the envelope curve detector.

In particular, it may be provided that the calibration is carried out during the production or maintenance of the apparatus or that the calibration is carried out between different successive digitizations of the optical signals. The voltage source can be connected to the receiver permanently or temporarily. A temporarily connected voltage source can be used for calibration purposes during the production or maintenance of the apparatus. Then, all of the calibration data are stored in the digital processing apparatus of the apparatus and are used for numerical calibration or correction of the signals. A permanently integrated voltage source can be used to receive the calibration data at any suitable instant between the light measurements. Such a calibration with an integrated source can be more precise, because it is based on the actual state of the systems.

It may be provided that both the frequency and the amplitude of the Brillouin signals are determined. In this case the amplitudes of the Brillouin signals can be measured in succession at different frequencies; and thereafter a peak frequency can be determined from a peak fit of the amplitudes over the frequency.

BRIEF DESCRIPTION OF THE DRAWINGS

Other features and advantages of the disclosed methods and apparatus will become apparent from the following description of example embodiments with reference to the accompanying drawings, wherein.

In the figures the same or functionally identical parts are provided with identical reference symbols. The dashed connecting lines represent optical signals that are preferably guided in light conductors. The solid connecting lines represent electrical signal lines.

DETAILED DESCRIPTION

Figure 1:
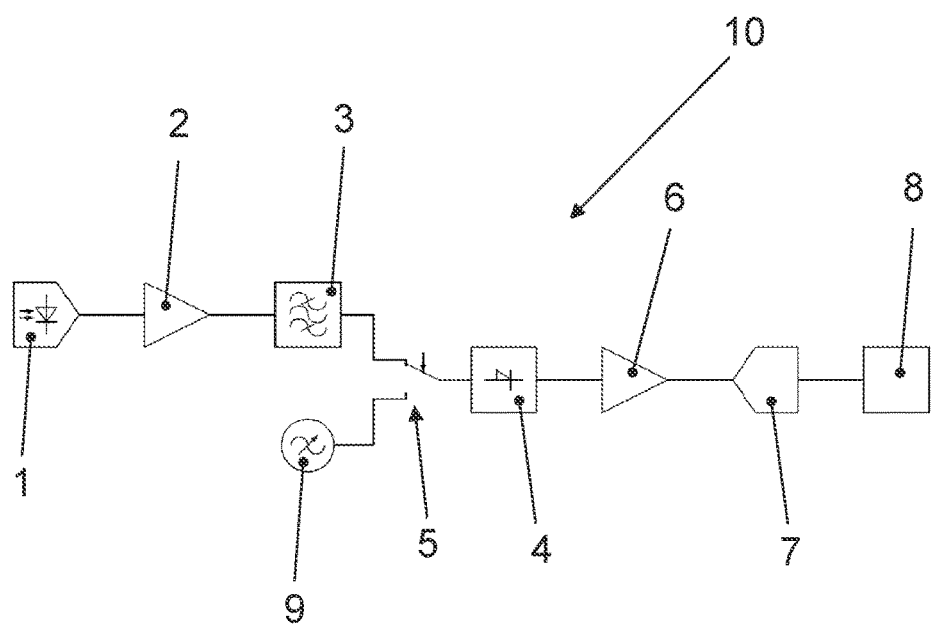
FIG. 1 shows a schematic representation of an apparatus for digitizing an optical signal.

The embodiment of an apparatus 10, which is shown in FIG. 1 and is intended for digitizing an optical signal, comprises an optical detector 1, which receives, for example, a high frequency, amplitude-modulated optical signal and generates a photocurrent.

Furthermore, the apparatus 10 comprises one or more amplifiers 2 that are designed as transimpedance amplifiers. The amplifier 2 is optional and can also be omitted. The at least one amplifier 2 amplifies the electric signal generated by the optical detector 1 and, in so doing, converts the current into a voltage.

There is certainly the possibility that the amplifier 2, designed as a transimpedance amplifier, is integrated in the optical detector 1. In this case the photocurrent in the optical detector 1 is converted into a voltage signal that is applied to the output of the optical detector 1.

Furthermore, the apparatus comprises a bandpass filter 3 that filters a direct current component out of the amplified signal and during further processing filters out the unnecessary or, more specifically, interfering frequency ranges.

Furthermore, the apparatus 10 comprises an envelope curve detector 4, the input of which is connected to the output of the bandpass filter 3 by a switch 5. The switch 5 is optional and can also be omitted.

The envelope curve detector 4 determines the amplitude of the electric signal, filtered by the bandpass filter 3, and outputs an electric signal, corresponding to this amplitude. In so doing, the envelope curve detector 4 removes the carrier frequency from the signal and allows the amplitude to be sampled and/or digitized at the lower signal modulation frequency. In principle, the high frequency signal is rectified and then filtered for smoothing.

Furthermore, the apparatus 10 comprises an amplifier 6, which amplifies the electric signal, outputted from the envelope curve detector 4, to a level that is suitable for subsequent digitizing. The amplifier 6 is optional and can also be omitted. Furthermore, the apparatus 10 comprises an analog to digital converter 7 that digitizes the signal, outputted from the amplifier 6.

Furthermore, the apparatus 10 comprises a digital processing apparatus 8, which can store the calibration data (which will be described below in more detail), and, using these calibration data, can normalize or linearize the data, outputted from the analog to digital converter 7, over a large dynamic range.

Furthermore, the apparatus 10 comprises a variable voltage source 9. The optional switch 5 switches the input of the envelope curve detector 4 between the amplified photovoltage, applied to the output of the bandpass filter 3, and the output of the variable voltage source 9.

The voltage source 9 can supply, in particular, a variable voltage signal having the same or a similar frequency as the photovoltage to be detected.

There is the option that the voltage source generates a variable voltage signal that has the same or a similar frequency as the electric signal that is generated from the optical signal. In particular, the voltage signals, generated by the variable voltage source, can be in a frequency range that is equal to, smaller or larger than the frequency range of the electric signals, generated from the optical signal. In particular, in this case the frequency range of the voltage signals, generated by the variable voltage source, can cover the frequency range of the electric signals, generated from the optical signal. As an alternative, the voltage signals, generated by the variable voltage source, can also have only a single frequency or a narrow frequency range that is in the frequency range of the electric signals, generated from the optical signal.

For example, the frequency range of the electric signals, generated from the optical signal, may be between 823.5 MHz and 935 MHz. In this case the voltage signals, generated by the variable voltage source, may be in a frequency range that ranges from at least 823.5 MHz to 935 MHz. In this respect it is certainly possible that the frequency range of the voltage signals, generated by the variable voltage source, is larger, thus, for example, ranges from 800 MHz to 960 MHz. As an alternative, in this example it can also be provided that the frequency range of the voltage signals, generated by the variable voltage source, is smaller and is within the frequency range of the electric signals, generated from the optical signal. For example, the voltage signals, generated by the variable voltage source, may have a constant frequency of 890 MHz +/−3 ppm.

The amplitude of the voltage signals, generated by the variable voltage source, changes with the operating temperature and the time by just a negligibly small amount. In particular, the exact value of this change can be stored in the device.

The output of the voltage source 9 should be adjustable over the whole range of the photovoltages to be expected. As an alternative, the signal switching can also be achieved by switching on and off the variable voltage source 9 or the optical detector 1, serving as the signal source, or the amplifier 2.

The voltage source 9 can be used for calibrating the envelope curve detector 4 and any possible amplifier 6 behind the switch position over the entire voltage range to be measured. The calibration can or should be carried out at a plurality of temperatures, distributed in a suitable way over the operating temperature range of the envelope curve detector 4. Such a setup can be used ideally to completely cancel out any nonlinearity and temperature effects on the receiver components behind the switch position.

The voltage source 9 can be connected to the envelope curve detector 4 or the switch 5 permanently or temporarily. A temporarily connected voltage source 9 can be used for calibration purposes during the production or maintenance of the envelope curve detector 4 and optionally the amplifier 6. Then all of the calibration data are stored in the digital processing apparatus 8 and used for numerical calibration or correction of the signals, generated by the analog to digital converter 7.

A permanently integrated voltage source 9 can be used to receive the calibration data at any suitable instant between the light measurements. Such a calibration with an integrated voltage source 9 can be more precise, because it is based on the actual state of the systems.

Figure 2:
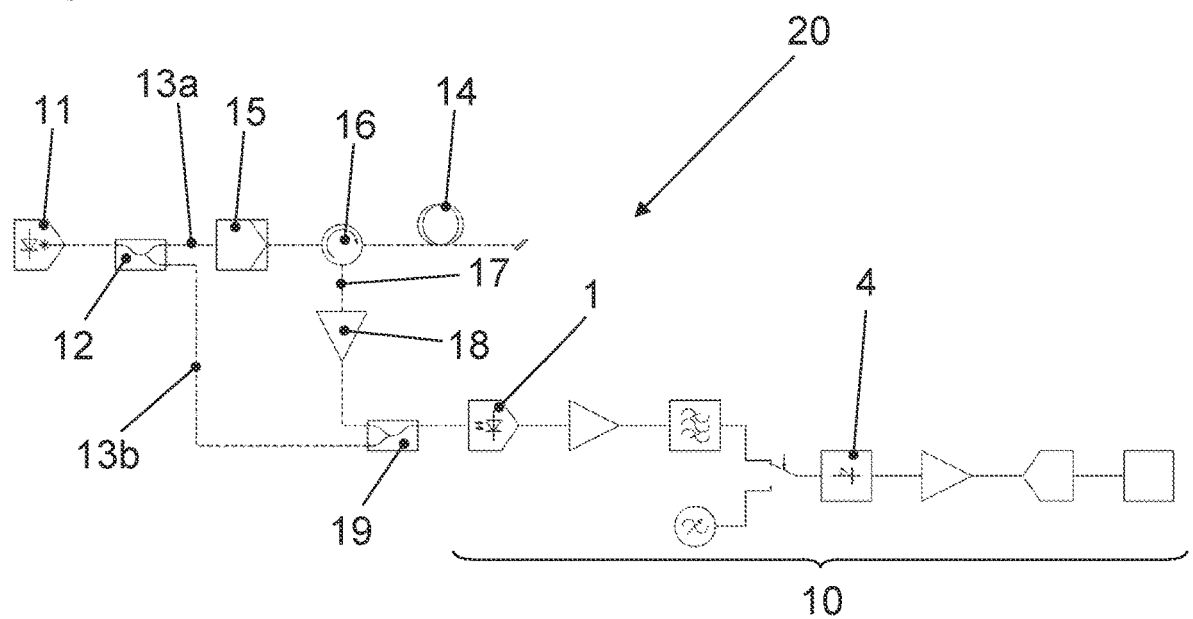
FIG. 2 shows a schematic representation of a first embodiment of an apparatus for spatially resolved measurement of temperature and strain via Brillouin scattering.

FIG. 2 shows a first embodiment of an apparatus 20 for spatially resolved measurement of temperature and strain via Brillouin scattering. In the apparatus 20, shown in FIG. 2, an optical superimposition with the laser radiation, which is employed for the excitation of the Brillouin scattering, is used.

The apparatus 20, shown in FIG. 2, comprises a laser light source 11 that emits narrow band laser radiation, for example, with a line width of 1 MHz. Furthermore, the laser radiation of the laser light source 1 has a constant power of, for example, a few 10 mW. Preferably, frequency-stabilized diode lasers, such as, for example, a DFB laser or other narrow band lasers, the emission wavelength of which is arranged in the near infrared region, for example, at 1550 nm, are used as a laser light source 11.

Furthermore, the apparatus 20, shown in FIG. 2, comprises a beam splitter 12, which is designed as a fiber optic splitter and can split the laser radiation of the laser light source 11 in two components 13a, 13b. The first component 13a is coupled into the optical fiber 14, which is used for measurement and with which the temperature and strain are to be determined in a spatially resolved manner by way of excitation of Brillouin scattering. The second component 13b is used for superimposition with a Brillouin signal, which is generated via Brillouin scattering and is coupled out of the optical fiber 14 (which will be described below in more detail).

Furthermore, the apparatus comprises an optical modulator 15 that can modulate the first component 13a of the laser radiation in accordance with the method used for the spatial association of the scattering signals. For example, when using an OTDR (optical time domain reflectometry) method, pulses are formed, and, when using an OFDR (optical frequency domain reflectometry) method, amplitude-modulated signals are formed from the first component 13a. An optical amplifier (not shown) may amplify the first component 13a of the laser radiation that is used for measurement, before the first component is guided into the optical fiber 14, used for measurement, by way of an optical, in particular, fiber optic, circulator 16, which is also comprised by the apparatus.

Brillouin scattered signals are generated in the optical fiber 14 used for measurement. The Brillouin scattered signals are returned to the optical circulator 16 with a propagation delay of about 10 µs/km, corresponding to the distance; and from the optical circulator they are guided into the receive path 17 of the apparatus. An optional optical filter (not shown), such as, for example, a fiber Bragg grating (FBG), may be used to suppress Rayleigh scattered light, in order to prevent interference with the measurement of the weaker Brillouin signal. Furthermore, an optical amplification by an optional optical amplifier 18 can take place in the receive path 17.

The Brillouin signal and the second component 13b of the laser radiation are coupled by an optical, in particular, fiber optic, coupler 19. The apparatus 20 comprises, as an apparatus for digitizing an optical signal, an apparatus 10, according to FIG. 1. In this case, the Brillouin signal, superimposed with the second component 13b of the laser radiation, is detected by the optical detector 1.

In particular, in this case a beat signal with the difference frequency between the Brillouin signal and the laser radiation component is produced in the range around 10 GHz. The frequency and the amplitude of this beat signal depend on the material of the optical fiber 14, used for the measurement, the temperature and the strain.

The amplitude of the beat signal is proportional to the square root of the product of the powers of the Brillouin signal and the laser radiation component. Thus, a significantly stronger measurement signal is produced by using high laser powers than by a direct measurement of the Brillouin scattered light, thus, significantly improving the detection sensitivity of the apparatus.

Figure 3:
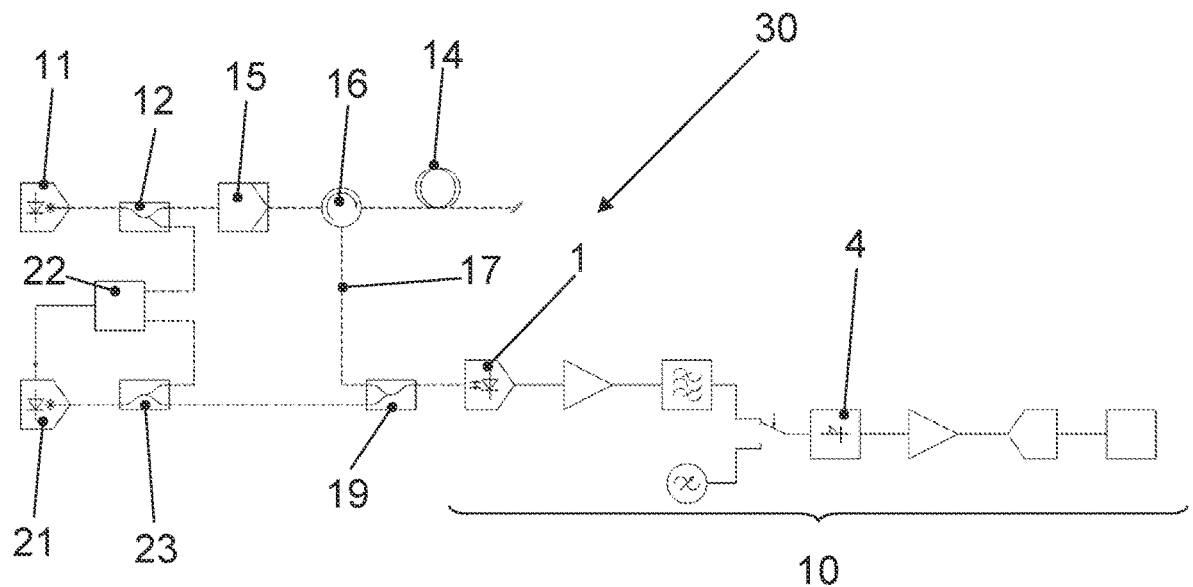
FIG. 3 shows a schematic representation of a second embodiment of an apparatus for spatially resolved measurement of temperature and strain via Brillouin scattering.
Figure 4:
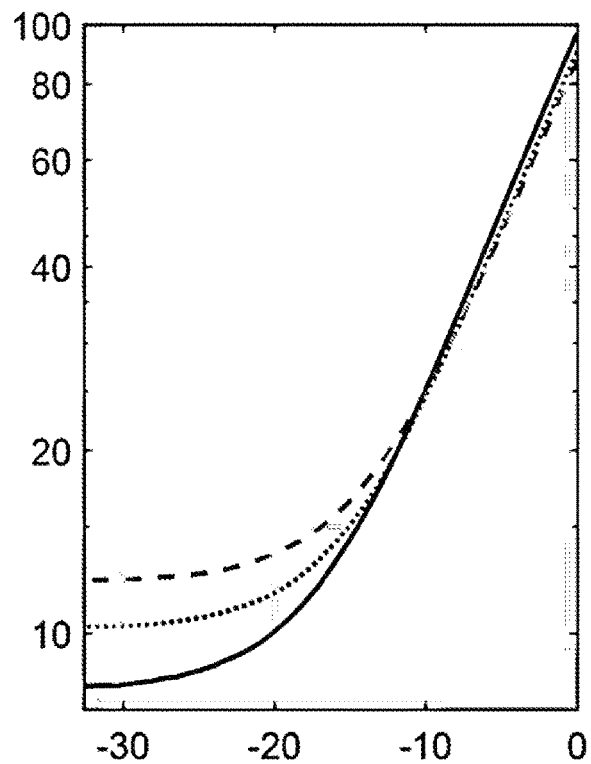
FIG. 4 shows a diagram illustrating the temperature dependence of an envelope curve detector, where in this case the strength of the input signal is shown in dB on the abscissa, and the output signal is shown in arbitrary units on the ordinate.

In contrast to the apparatus 20, according to FIG. 2, the apparatus 30, according to FIG. 3, has, in addition to the first laser light source 11, a second narrow band laser light source 21, the laser radiation of which is used for superimposition with the Brillouin signal. In this case, the frequency of this second laser light source 21 is adjusted such that it is shifted with respect to the frequency of the first laser light source 11 such that the difference frequency between the Brillouin scattered light and the second laser light source 21 is below 1 GHz. Typical Brillouin frequencies range from 10 to 13 GHz; in particular, in the case of a standard single mode fiber, are about 10.8 GHz.

At this point it should be noted that the temperature dependence of the Brillouin peak is also fiber specific and, for example, in the case of a standard single mode fiber, is about 1.1 MHz/Kelvin.

For example, when quartz glass optical fibers are used, it is necessary for the frequency of the two laser light sources 11, 21 to shift with respect to each other by somewhat more than 10 GHz, in order to achieve a difference frequency between the Brillouin scattered light and the second laser light source 21 below 1 GHz.

When the difference frequency is below 1 GHz, it is possible to use an optical detector 1, which has a lower detection limit, with a cutoff frequency below 1 GHz. In addition, the amplification and filtering of the signals are easier and more efficient in this frequency range.

For the stabilization of the second laser light source 21 to the desired frequency spacing from the first laser light source 11, a phase control loop with an optical input signal is used. The phase control loop is referred to below as an O-PLL (optical phase locked loop) 22 and is shown only as a schematic representation. A portion of the laser radiation of both laser light sources 11, 21 is split off by a beam splitter 12, 23, designed as a fiber optic splitter; is combined with a fiber optic coupler with the correct polarization; and is then superimposed on an optical detector. The measured signal contains a component at the difference frequency of both laser light sources 11, 21, which should be in the range around 10 GHz. The frequency of the signal is compared in the O-PLL 22 with the frequency of an electronic local oscillator, which was adjusted to the desired difference frequency. The frequency of one of the two laser light sources 11, 21 is adjusted by the comparison signal such that the difference frequency of the laser light sources 11, 21 will match that of the local oscillator. If diode lasers are used, then the laser frequency is adjusted preferably by the operating current.

The Brillouin signal is superimposed with a component of the laser radiation, emitted from the second laser light source 21, in the coupler 19. The apparatus 30 also comprises, as an apparatus for digitizing an optical signal, an apparatus 10, according to FIG. 1. In this case the Brillouin signal, superimposed with the component of the laser radiation, emitted from the second laser light source 21, is detected by the optical detector 1. In this way both the frequency and the amplitude of the Brillouin signals can be determined.

In this case the apparatus 10 measures the amplitude at a certain frequency, which is separated from the bandpass filter 3, and which is given by the frequency difference between the Brillouin signal frequency and the frequency spacing between the two laser light sources 11, 21. The frequency measurement consists of measuring in succession the amplitudes at different frequencies and then to determine the peak frequency from a peak fit of the amplitudes over the frequency.

What is claimed is:

1. An apparatus for digitizing an optical signal, comprising:
    an optical detector to detect an optical signal and to generate an electric signal corresponding to the optical signal;

an envelope curve detector to determine the amplitude of the electric signal or a modified electric signal resulting from the electric signal, and to supply an amplitude signal corresponding to the amplitude;

an analog to digital converter to digitize the amplitude signal and to supply a corresponding digitized amplitude signal; and a variable voltage source to generate a variable voltage signal to calibrate the envelope curve detector, wherein the variable voltage signal has the same or a similar frequency as the electric signal generated from the optical signal.

2. The apparatus of claim 1, further comprising:
a bandpass filter, arranged between the optical detector and the envelope curve detector, to filter out of the electric signal a direct current component and/or at least one frequency range that, when determining the amplitude via the envelope curve detector, is not needed and/or is interfering.

3. The apparatus of claim 2, further comprising:
a transimpedance amplifier, arranged between the optical detector and the envelope curve detector or between the optical detector and the bandpass filter, to amplify the electric signal.

4. The apparatus of claim 3, further comprising:
a switch, arranged between the optical detector or the amplifier or between the bandpass filter and the envelope curve detector or between the variable voltage source and the envelope curve detector, wherein the switch is configured either to send to the envelope curve detector the electric signal, generated indirectly or directly by the optical detector, or to connect an output of the variable voltage source to the envelope curve detector.

5. The apparatus of claim 1, further comprising:
an amplifier, arranged between the envelope curve detector and the analog to digital converter, to amplify the amplitude of the electric signal generated by the envelope curve detector.

6. The apparatus of claim 1, further comprising:
a digital processing apparatus to store calibration data generated during calibration of the envelope curve detector and to normalize the digitized amplitude signal with the calibration data.

7. An apparatus for spatially resolved measurement of temperature and strain via Brillouin scattering, comprising:
at least one laser light source to generate laser radiation;
an optical fiber into which the laser radiation is coupled, wherein Brillouin signals generated by the laser radiation due to Brillouin scattering are coupled out of the optical fiber; and
the apparatus for digitizing an optical signal of claim 1, configured to digitize the Brillouin signals coupled out of the optical fiber.

8. A method for spatially resolved measurement of temperature and strain via Brillouin scattering, comprising:
generating laser radiation;
coupling the laser radiation into an optical fiber to measure temperature and strain;
coupling Brillouin signals generated by the laser radiation in the optical fiber out of the optical fiber; and
digitizing the Brillouin signals coupled out of the optical fiber with the apparatus for digitizing an optical signal of claim 1.

9. The method, of claim 8, wherein both frequencies and amplitudes of the Brillouin signals are determined.

10. The method of claim 9, wherein the amplitudes of the Brillouin signals are measured in succession at different frequencies and, thereafter, a peak frequency is determined from a peak fit of the amplitudes over the different frequencies.

11. A method for digitizing an optical signal, comprising:
generating an electric signal corresponding to a detected electric signal;
determining, via an envelope curve detector, an amplitude of the electric signal or a modified electric signal resulting from the electric signal;
generating an amplitude signal corresponding to the amplitude;
digitizing the amplitude signal to produce a digitized amplitude signal; and
calibrating the envelope curve detector with a variable voltage signal generated by a variable voltage source, wherein the variable voltage signal has the same or a similar frequency as the electric signal generated from the optical signal.

12. The method of claim 11, wherein calibrating the envelope curve detector includes sending a plurality of mutually different voltages, generated by the variable voltage source, to the envelope curve detector.

13. The method of claim 11, wherein calibrating the envelope curve detector is carried out at a plurality of mutually different temperatures of the envelope curve detector.

14. The method of claim 11, wherein calibrating the envelope curve detector includes generating calibration data, the method further comprising:
storing the calibration data; and
normalizing the digitized amplitude signal with the calibration data.

15. The method of claim 11, wherein calibrating the envelope curve detector is carried out either during production or maintenance of an apparatus comprising the envelope curve detector or between different successive digitizations of amplitude signals.

\* \* \* \* \*